US010276342B2

(12) United States Patent
Mukai

(10) Patent No.: US 10,276,342 B2
(45) Date of Patent: Apr. 30, 2019

(54) ELECTRON MICROSCOPE

(71) Applicant: JEOL Ltd., Tokyo (JP)

(72) Inventor: Masaki Mukai, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 15/952,989

(22) Filed: Apr. 13, 2018

(65) Prior Publication Data

US 2018/0301315 A1 Oct. 18, 2018

(30) Foreign Application Priority Data

Apr. 14, 2017 (JP) ................................. 2017-080367

(51) Int. Cl.
| | | |
|---|---|---|
| *H01J 37/153* | (2006.01) | |
| *H01J 37/22* | (2006.01) | |
| *H01J 37/21* | (2006.01) | |
| *H01J 37/05* | (2006.01) | |
| *H01J 37/12* | (2006.01) | |
| *H01J 37/14* | (2006.01) | |

(52) U.S. Cl.
CPC ............ *H01J 37/153* (2013.01); *H01J 37/05* (2013.01); *H01J 37/12* (2013.01); *H01J 37/14* (2013.01); *H01J 37/21* (2013.01); *H01J 37/22* (2013.01); *H01J 2237/057* (2013.01); *H01J 2237/1532* (2013.01); *H01J 2237/24578* (2013.01); *H01J 2237/24585* (2013.01)

(58) Field of Classification Search
CPC .. H01J 37/05; H01J 37/12; H01J 37/14; H01J 37/153; H01J 37/26; H01J 2237/057; H01J 2237/153; H01J 2237/24578; H01J 2237/24585
See application file for complete search history.

(56) References Cited

U.S. PATENT DOCUMENTS

| | | | | |
|---|---|---|---|---|
| 2013/0248699 A1* | 9/2013 | Mukai | ................... | H01J 37/023 250/252.1 |
| 2016/0041064 A1* | 2/2016 | Morishita | ............... | H01J 37/26 702/189 |

FOREIGN PATENT DOCUMENTS

JP 2013196929 A 9/2013

OTHER PUBLICATIONS

European Search Report dated Sep. 10, 2018 issued in related European application No. 18167278.

* cited by examiner

*Primary Examiner* — David E Smith
(74) *Attorney, Agent, or Firm* — The Webb Law Firm

(57) ABSTRACT

An electron microscope includes a monochromator, an image acquiring portion for obtaining an electron microscope image containing interference fringes of the electron beam formed by an aperture located behind the monochromator, a line profile acquiring portion for obtaining a plurality of line profiles passing through the center of the aperture on the EM image, an energy dispersion direction identifying portion for identifying the direction of energy dispersion of the monochromator on the basis of the line profiles obtained by the line profile acquiring portion, and an optics controller for controlling an optical system on the basis of a line profile in the direction of energy dispersion to bring the focal plane for the electron beam exiting from the monochromator into coincidence with the achromatic plane.

7 Claims, 7 Drawing Sheets

ELECTRON MICROSCOPE

CROSS-REFERENCE TO RELATED APPLICATION

This application claims priority to Japanese Patent Application No. 2017-080367 filed Apr. 14, 2017, the disclosure of which is hereby incorporated in its entirety by reference.

BACKGROUND OF THE INVENTION

Field of the Invention

The present invention relates to an electron microscope.

Description of Related Art

To achieve higher resolution of electron energy loss spectroscopy (EELS) in a transmission electron microscope, a monochromator is used. Furthermore, in such a transmission electron microscope, the information limit of a transmission electron microscope (TEM) image can be improved by monochromatizing the electron beam using the monochromator. Also, the structures of substances can be observed at atomic resolution. Furthermore, using the monochromator and an aberration corrector on the illumination side, electronic states of atomic scale microscopic regions in a substance can be analyzed by the use of both high-angle annular dark field scanning transmission electron microscopy (HAADF-STEM) and electron energy loss spectroscopy (EELS). In the HAADF-STEM, atomic scale spatial resolution and high energy resolution are accomplished simultaneously.

In an electron microscope such as a transmission electron microscope (TEM) or a scanning transmission electron microscope (STEM), a monochromator is used to monochromatize an electron beam directed at a sample. Various types of monochromators have been proposed and are classified into two major types: single-stage filter type and two-stage filter type.

The single-stage filter type monochromator is composed of an energy filter, operating to spectrally disperse an electron beam, and an energy-selecting slit. An electron beam emitted from an electron beam source is spectrally dispersed by the energy filter and focused onto an energy-selecting slit plane. Because the electron beam is spectrally dispersed, a spectrum corresponding to the electron velocity distribution across the electron beam is formed on the energy-selecting slit. Only electrons of uniform velocity are allowed to pass through the energy-selecting slit. Thus, the electron beam is monochromatized. The electron beam passed through the energy-selecting slit forms a spectrum corresponding to the width of the slit on the focal plane and, therefore, a virtual source of the electron beam does not assume a circular form. Consequently, in a scanning transmission electron microscope (STEM) image obtained by focusing the electron beam onto the sample, the shape of the electron beam source that is spread along the direction of the spectrum is reflected. Thus, anisotropy of the resolution occurs. Furthermore, in a transmission electron microscope (TEM) image obtained by illuminating a wide area of a sample with an electron beam, anisotropy appears in the coherency of the electron beam because of the shape of the virtual source that is spread along the direction of the spectrum.

The two-stage filter type monochromator includes two stages of energy filters and an energy-selecting slit disposed between the energy filters. The combination of the first stage of energy filter and the energy-selecting slit is similar in configuration to a single-stage filter type monochromator. In the two-stage filter type monochromator, the energy dispersion across the electron beam passed through the energy-selecting slit is canceled by the second stage of energy filter. As a result, after the exit from the monochromator, the focal plane and achromatic plane agree. The electron beam which is achromatized at the focal plane creates a circular virtual source of electrons at the focal plane. Hence, in a scanning transmission electron microscope (STEM) image obtained by focusing the electron beam onto a sample, anisotropy of the resolution does not appear. Electronic states of the substance can be examined in detail by high-resolution EELS at nanometer scale or subnanometer scale spatial resolution. Additionally, in a transmission electron microscope (TEM) image obtained by illuminating a wide area of a sample with an electron beam, high-resolution imaging is enabled both by isotropic electron beam coherence at a virtual source of electrons in the form of a spot and by decreased effects of chromatic aberration owing to monochromatized electron beam illumination.

The great advantage of the two-stage filter type monochromator over the single-stage filter type monochromator is that a virtual source of a monochromatized and achromatic electron beam results. To realize this advantage of the two-stage filter type monochromator, the optical system of the monochromator needs to be set to satisfy two conditions: focusing of the electron beam at the energy-selecting slit and achromaticity at the focal plane after exit from the monochromator. However, because of complexity of the structure of the two-stage filter type monochromator, realizing these conditions in the optical system of actual instrumentation involves difficulties. Especially, it is difficult to judge whether it is possible to adjust the achromaticity at the focal plane after exit from the monochromator.

As one approach to this problem, patent document 1 discloses a method of making an adjustment easily to bring the focal plane and the achromatic plane into coincidence by forming interference fringes of the electron beam by an aperture located behind the monochromator and carrying out such an adjustment based on the intensity distribution of the interference fringes on a TEM image.

CITATION LIST

Patent Documents

Patent document 1: JP-A-2013-196929

As noted above, patent document 1 discloses an adjusting method capable of easily making an adjustment to bring the focal plane and achromatic plane into coincidence in a two-stage filter type monochromator. However, to perform the adjustment set forth in patent document 1, the user must control the optical system in such a way that the interference fringes on the TEM image appear most isotropically. This needs some degree of skill. Therefore, there is a need for an electron microscope which can carry out this adjustment easily without reliance on the user's level of skill.

SUMMARY OF THE INVENTION

The present invention has been made in view of the foregoing problem. One object associated with some aspects of the present invention is to provide an electron microscope in which an adjustment for bringing the focal plane for an electron beam exiting from a two-stage filter type monochromator into coincidence with an achromatic plane can be made easily.

(1) An electron microscope associated with the present invention is equipped with a monochromator that has a first energy filter for dispersing an electron beam according to kinetic energy, an energy-selecting slit disposed on an energy dispersive plane, and a second energy filter for canceling energy dispersion of the electron beam passed through the energy-selecting slit. The electron microscope comprises: an image acquiring portion for obtaining an electron microscope (EM) image containing interference fringes of the electron beam formed by an aperture located behind the monochromator; a line profile acquiring portion for obtaining a plurality of line profiles passing through the center of the aperture on the EM image; an energy dispersion direction identifying portion for identifying the direction of energy dispersion of the monochromator on the basis of the plurality of line profiles obtained by the line profile acquiring portion; and an optics controller for controlling an optical system on the basis of a line profile in the direction of energy dispersion to bring a focal plane for the electron beam exiting from the monochromator into coincidence with an achromatic plane.

In this electron microscope, the operation for bringing the focal plane for the electron beam emerging from the monochromator into coincidence with the achromatic plane can be performed automatically. Consequently, in this electron microscope, an adjustment for bringing the focal plane for the electron beam emerging from the monochromator into coincidence with the achromatic plane can be performed easily without reliance on the user's level of skill.

(2) In one feature of the electron microscope of (1) above, the energy dispersion direction identifying portion may find the ratio of a local maximum value to a local minimum value for each of the plurality of line profiles and identify the direction of energy dispersion on the basis of the found ratios.

This electron microscope can identify the direction of energy dispersion of the monochromator from the plurality of line profiles obtained by the line profile acquiring portion.

(3) In one feature of electron microscope of (1) or (2) above, the optics controller may control the optical system on the basis of the ratio of a local maximum value to a local minimum value of the line profile in the direction of energy dispersion.

In this electron microscope, the operation for bringing the focal plane for the electron beam emerging from the monochromator into coincidence with the achromatic plane can be performed automatically.

(4) In one feature of the electron microscope of any one of (1) to (3) above, wherein the optics controller may control the strength of electromagnetic field of at least one of the first energy filter and the second energy filter on the basis of the line profile in the direction of energy dispersion to bring the achromatic plane into coincidence with the focal plane.

(5) In one feature of the electron microscope of any one of (1) to (4) above, wherein the optics controller may control an electrostatic lens mounted ahead of the monochromator on the basis of the line profile in the direction of energy dispersion to bring the focal plane into coincidence with the achromatic plane.

(6) In another feature of the electron microscope of any one of (1) to (4) above, wherein the optics controller may control a magnetic lens mounted ahead of the monochromator on the basis of the line profile in the direction of energy dispersion to bring the focal plane into coincidence with the achromatic plane.

(7) In a further feature of the electron microscope of any one of (1) to (4) above, wherein the optics controller may control astigmatism produced by the monochromator on the basis of the line profile in the direction of energy dispersion to bring the focal plane into coincidence with the achromatic plane.

DESCRIPTION OF THE INVENTION

The preferred embodiments of the present invention are hereinafter described in detail with reference to the drawings. It is to be understood that the embodiments provided below do not unduly restrict the scope and content of the present invention delineated by the appended claims and that not all the configurations described below are essential constituent components of the invention.

In the following description, a transmission electron microscope (TEM) is taken as one example of the electron microscope associated with the present invention. However, the electron microscope associated with the present invention may also be a scanning transmission electron microscope (STEM) or a scanning electron microscope (SEM). That is, in the present invention, an electron microscope (EM) image may be a transmission electron microscope (TEM) image, a scanning transmission electron microscope (STEM) image, or a scanning electron microscope (SEM) image.

1. First Embodiment 1.1. Configuration of Electron Microscope

Figure 1:
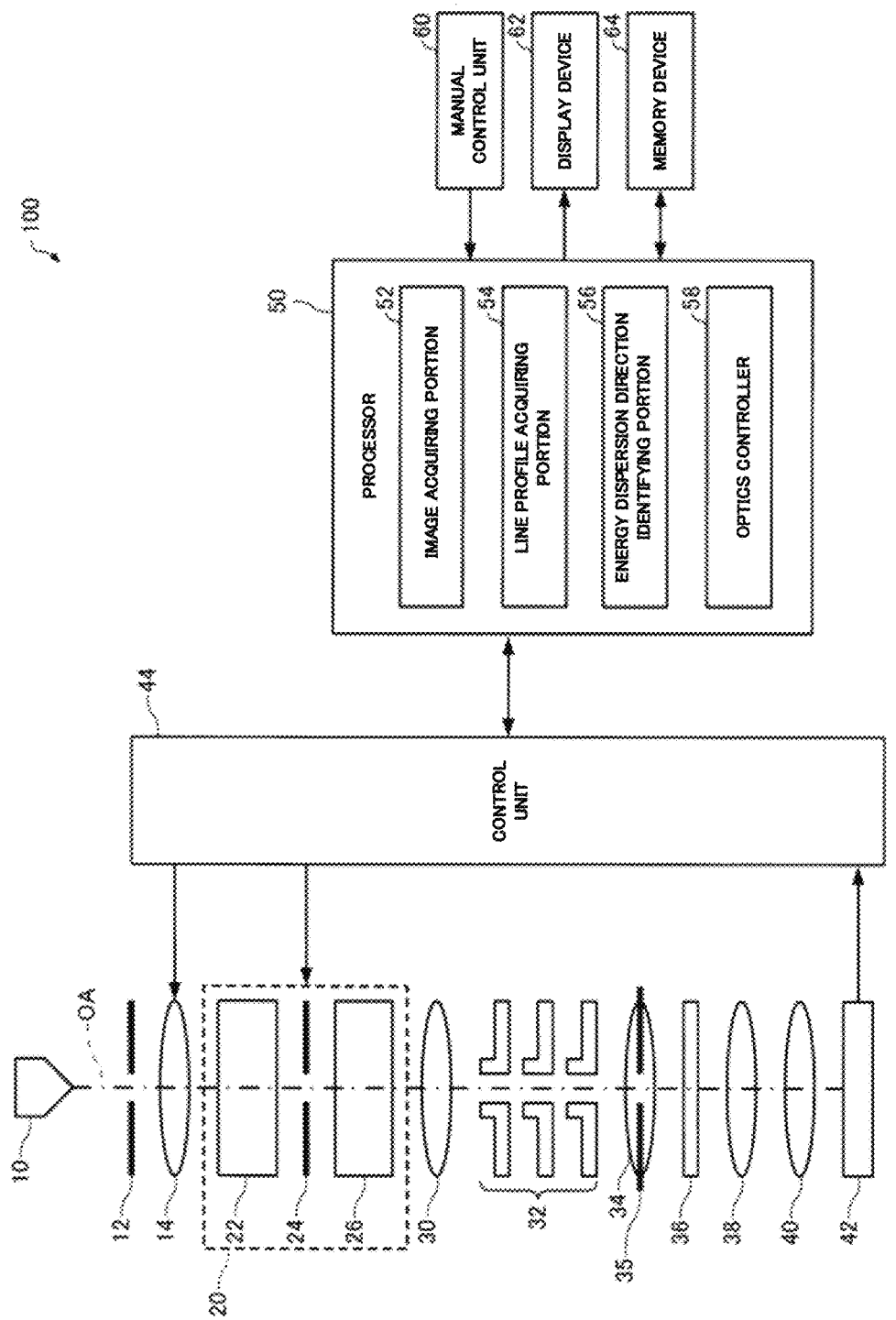
FIG. 1 is a diagram, partly in block form, showing the configuration of an electron microscope associated with a first embodiment of the present invention.

The configuration of an electron microscope, 100, associated with a first embodiment of the present invention is first described by referring to FIG. 1, which shows the configuration of the electron microscope 100. The electron microscope 100 is equipped with a monochromator 20 for monochromatizing an electron beam made to impinge on a sample.

As shown in FIG. 1, the electron microscope 100 includes an electron beam source 10, an aperture 12, a first electrostatic lens 14, the monochromator 20, a second electrostatic lens 30, an accelerator tube 32, an illumination lens system 34, a sample stage 36 for holding the sample, an objective lens 38, a projector lens system 40, a detector 42, a control unit 44, a processor 50, a manual control unit 60, a display device 62, and a memory device 64.

The electron beam source 10 has an anode for accelerating electrons exiting from a cathode and releases an electron beam. One example of the electron beam source 10 is a well-known electron gun.

The first electrostatic lens 14 is mounted ahead of the monochromator 20 and operates to adjust the trajectory (i.e., the angle of incidence of the incident electron beam relative to the monochromator 20) of the electron beam emitted from the electron beam source 10. The first electrostatic lens 14 is controlled by the control unit 44, which in turn controls the strength of the first electrostatic lens 14 on the basis of a control signal from the processor 50. The second electrostatic lens 30 for adjusting the trajectory of the electron beam directed at the sample is mounted behind the monochromator 20. The first and second electrostatic lenses 14, 30 focus the electron beam by electrostatic fields.

The monochromator 20 is incorporated in the illumination system of the electron microscope 100 and so the microscope 100 can illuminate the sample with the electron beam monochromatized by the monochromator 20.

The monochromator 20 is a two-stage filter type monochromator for monochromatizing an electron beam, and includes a first energy filter 22 for dispersing the electron beam according to kinetic energy, an energy-selecting slit 24 disposed on an energy dispersive plane, and a second energy filter 26 for canceling the energy dispersion of the electron beam passed through the energy-selecting slit 24.

Each of the first energy filter 22 and second energy filter 26 is made of a Wien filter for applying mutually orthogonal electric and magnetic fields to the electron beam traveling along an optical axis OA. The electric and magnetic fields of the second energy filter 26 are opposite in sense to those of the first energy filter 22. The first and second energy filters 22, 26 are controlled by the control unit 44, which in turn controls the strengths of the electromagnetic fields of the first energy filter 22 and second energy filter 26 on the basis of control signals from the processor 50.

Figure 2:
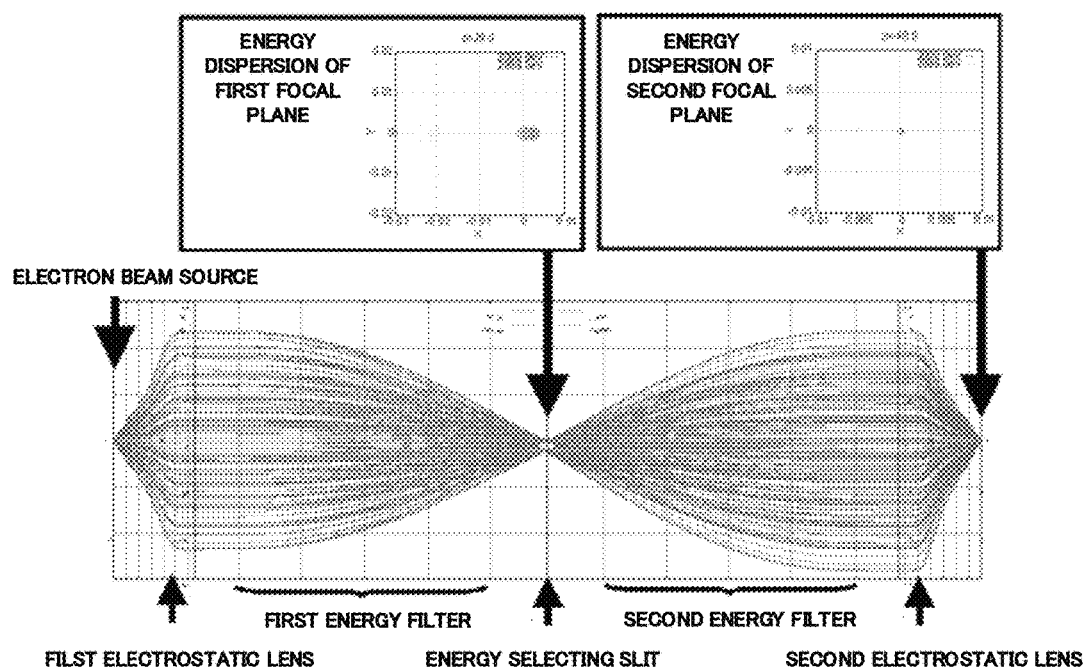
FIG. 2 is a ray diagram showing the trajectory of an electron beam in the monochromator of the electron microscope of FIG. 1.

FIG. 2 is a ray diagram showing the trajectory of the electron beam in the monochromator 20. The electron beam emitted from the electron beam source 10 is spectrally dispersed by the first energy filter 22 and focused onto a first focal plane where the energy-selecting slit 24 is disposed. Since the electron beam is spectrally dispersed, a spectrum corresponding to a distribution of velocities of the electrons in the electron beam is formed on the first focal plane. Only electrons of the electron beam within a given distance from the optical axis OA in the direction of the electric field pass through the slit 24. The energy dispersion of the electrons passed through the energy-selecting slit 24 is canceled by the second energy filter 26. Ideally, a second focal plane for the electron beam exiting from the monochromator 20 coincides with an achromatic plane where the energy dispersion is canceled. In this case, a virtual source of electrons on the second focal plane is circular in shape.

The electron beam monochromatized by the monochromator 20 is accelerated by the accelerator tube 32 and made to impinge on the sample stage 36 by the illumination lens system 34. The illumination lens system 34 is made up of a plurality of condenser lenses. In each condenser lens, a condenser aperture 35 is arranged.

The objective lens 38 is disposed behind the sample stage 36 and focuses the electron beam transmitted through the sample. The projector lens system 40 is located behind the objective lens 38, further magnifies the image focused by the objective lens 38, and focuses the magnified image onto the detector 42. The projector lens system 40 is made up of intermediate lenses and projector lenses.

The detector 42 is positioned behind the projector lens system 40 and detects a TEM image focused by the projector lens system 40. For example, the detector 42 is a CCD (charge-coupled device) camera, a CMOS (complementary metal oxide semiconductor) camera, or the like. Image information about the TEM image detected by the detector 42 is output to the processor 50 via the control unit 44.

The control unit 44 controls various component parts constituting the optical system of the electron microscope 100. Furthermore, the control unit 44 performs processing to send the image information from the detector 42 to the processor 50.

The manual control unit 60 permits a user to enter control information. The entered control information is output to the processor 50 from the manual control unit 60. The function of the manual control unit 60 can be implemented by a hardware device such as a keyboard, mouse, touch panel display, or the like.

The display device 62 is used to display the image generated by the processor 50. The function of the display device 62 can be implemented by an LCD, a CRT, or the like. The display device 62 displays a TEM image generated by the processor 50.

The storage device 64 stores programs, data, and related information permitting the processor 50 to perform various calculational operations and control operations. Furthermore, the storage device 64 is used as a working area for the processor 50 and is also used to temporarily store the results of calculations performed by the processor 50 in accordance with various programs and other results. The function of the storage device 64 can be realized by a hard disk, a RAM (random access memory), or the like.

The processor 50 performs an operation (described later) for bringing the focal plane for the electron beam exiting from the monochromator 20 into coincidence with the achromatic plane. The functions of the processor 50 can be implemented by executing programs using various processors such as CPU and DSP. At least some of the functions of the processor 50 may be realized by dedicated circuitry such as an ASIC (e.g., a gate array). The processor 50 includes an image acquiring portion 52, a line profile acquiring portion 54, an energy dispersion direction identifying portion 56, and an optics controller 58.

The image acquiring portion 52 acquires a TEM image by accepting the image information output from the detector 42. During an adjustment step (described later) for bringing the focal plane for the electron beam leaving the monochromator 20 into coincidence with the achromatic plane, the image acquiring portion 52 acquires the TEM image containing interference fringes of the electron beam formed by the condenser aperture 35.

The line profile acquiring portion 54 obtains a plurality of line profiles passing through the center of the condenser aperture 35 on the TEM image containing the interference fringes of the electron beam formed by the condenser aperture 35. The line profiles are graphed strength variations on the lines that lie on the TEM image.

The energy dispersion direction identifying portion 56 identifies the direction of energy dispersion of the monochromator 20 on the basis of the plural line profiles derived by the line profile acquiring portion 54. Electron beam rays which have been produced by spectrally splitting the electron beam by the first energy filter 22 are allocated to a certain direction according to their kinetic energy. This certain direction is referred to as the direction of energy dispersion.

The optics controller 58 controls the control system based on the line profile in the direction of energy dispersion identified by the energy dispersion direction identifying portion 56 to bring the focal plane of the electron beam existing from the monochromator 20 into coincidence with the achromatic plane. In the present embodiment, the optics controller 58 controls the strength of the electromagnetic field of at least one of the first energy filter 22 and the second energy filter 26 to bring the achromatic plane into coincidence with the focal plane.

1.2. Operation

The operation of the electron microscope 100 associated with the first embodiment to bring the focal plane for the electron beam exiting from the monochromator 20 into coincidence with the achromatic plane is next described.

In the electron microscope 100, the processor 50 carries out the operation for bringing the focal plane for the electron beam exiting from the monochromator 20 into coincidence with the chromatic plane.

If the electron beam focal point (virtual source of electrons) present ahead of the condenser aperture 35 is sufficiently small, the undiffracted portion of the electron beam interferes with the portion of the beam diffracted by the condenser aperture 35, producing interference fringes in the TEM image. If the energy dispersion of the electron beam remains on the focal plane for the electron beam exiting from the monochromator 20, i.e., the focal plane for the electron beam is not coincident with the achromatic plane, the virtual source of electrons is spread in the direction of spectrum. Therefore, isotropic interference does not take place. Rather, anisotropy occurs in the interference fringes.

On the other hand, if the focal plane for the electron beam emerging from the monochromator 20 is not coincident with the achromatic plane, the virtual source of electrons forms a circular spot and so interference fringes occur isotropically. That is, there are produced concentric interference fringes with less circumferential variations in strength. The processor 50 performs the operation for bringing the focal plane for the electron beam exiting from the monochromator 20 into coincidence with the achromatic plane while employing this principle.

Figure 3:
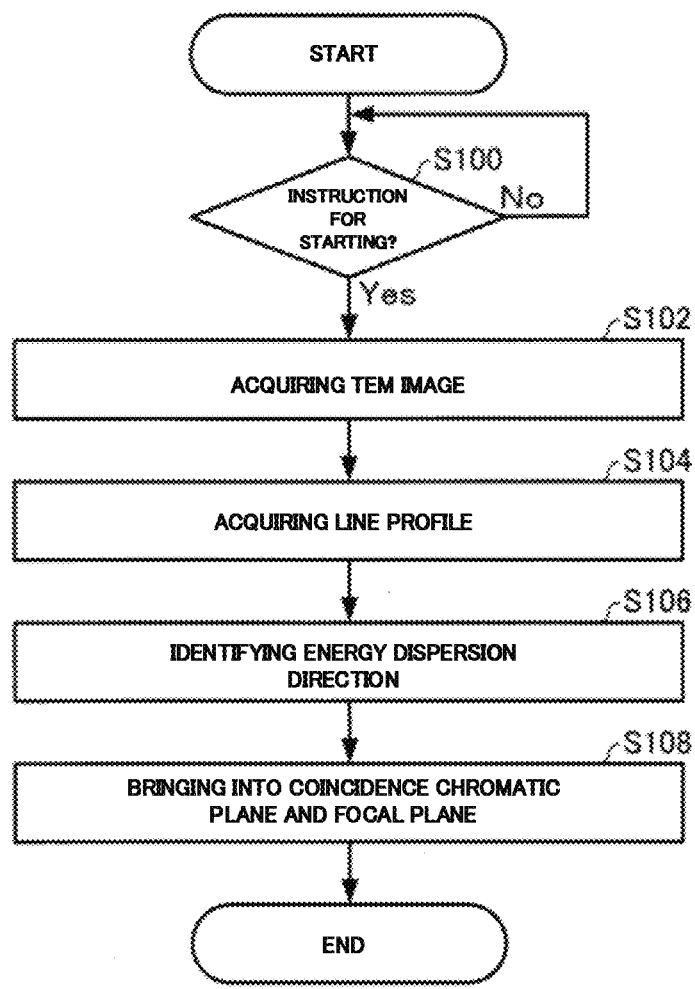
FIG. 3 is a flowchart illustrating one example of subroutine performed by a processor included in the electron microscope of FIG. 1.

FIG. 3 is a flowchart illustrating one example of subroutine performed by the processor 50 of the electron microscope 100 associated with the first embodiment.

First, the processor 50 makes a decision as to whether the user has issued an instruction for starting an adjustment for bringing the focal plane for the electron beam exiting from the monochromator 20 into coincidence with the achromatic plane (step S100). If the decision at step S100 is negative (No), then the processor 50 waits until an instruction for the start is given. The processor 50 determines that an instruction for the start has been issued if the user enters an instruction for the start via the manual control unit 60.

If the decision at step S100 is affirmative (Yes), indicating that an instruction for the start has been issued, the image acquiring portion 52 performs processing to obtain a TEM image containing interference fringes of the electron beam formed by the condenser aperture 35 (step S102).

In the present step S102, the image acquiring portion 52 first generates a control signal to control the energy-selecting slit 24 and outputs this control signal to the control unit 44, thus moving and opening the energy-selecting slit 24 such that no energy selection is done. Then, the image acquiring portion 52 generates a control signal to control the condenser aperture 35 and outputs this control signal to the control unit 44, thus inserting the condenser aperture 35 onto the optical axis OA. Then, the image acquiring portion 52 sets the imaging magnification to a prescribed value (e.g., 200,000 times) and controls the excitation of the illumination lens system 34 to permit the outer fringe of the condenser aperture 35 to be checked. Under this condition, the image acquiring portion 52 accepts the image information output from the detector 42, thereby obtaining the TEM image containing the interference fringes of the electron beam formed by the condenser aperture 35.

Figure 4:
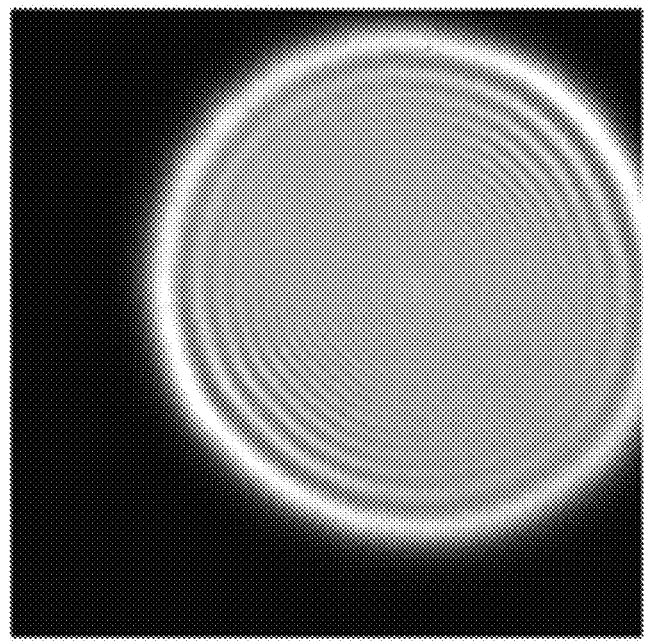
FIG. 4 is a TEM image containing interference fringes of the electron beam formed by a condenser aperture.

FIG. 4 is the TEM image containing the interference fringes of the electron beam formed by the condenser aperture 35. As shown in FIG. 4, interference fringes corresponding to the shadow of the condenser aperture 35 appear on the TEM image.

Then, the line profile acquiring portion 54 obtains a plurality of line profiles passing through the center of the condenser aperture 35 (center of the shadow) on the TEM image obtained by the image acquiring portion 52 (step S104).

Figure 5:
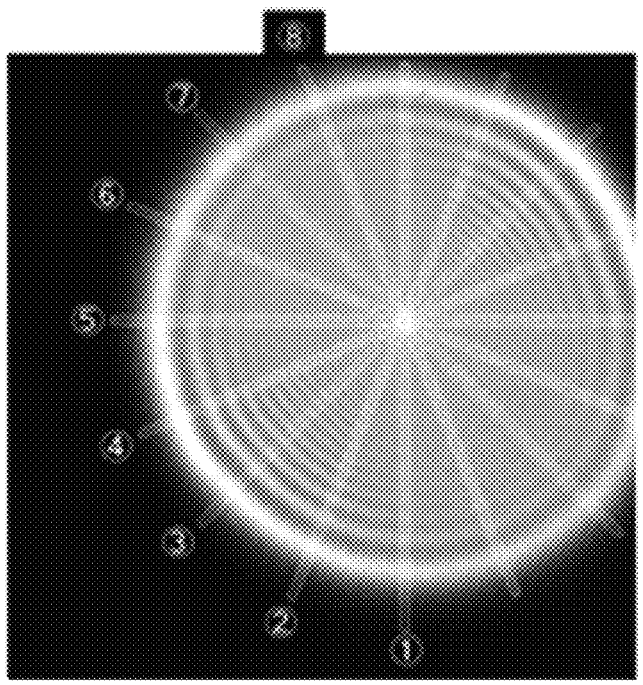
FIG. 5 is a diagram showing measurement lines used to measure line profiles.

FIG. 5 shows measurement lines used to measure line profiles. As shown in this FIG. 5, the line profile acquiring portion 54 determines the position of the center of the condenser aperture 35 and obtains line profiles passing through the center at regular angular intervals. In the illustrated example, 8 line profiles were obtained at angular intervals of 22.5 degrees. The line profiles are so obtained that they contain information about the strengths in a range extending from one peripheral end of the condenser aperture 35 through the center of the aperture 35 to the other peripheral end of the aperture 35.

It is to be noted that no restrictions are imposed on the number of obtained line profiles. However, if the number of line profiles is increased, the direction of energy dispersion of the monochromator 20 can be identified with higher accuracy. Furthermore, no restriction is placed on the width of the measurement lines, i.e., the region over which strengths in the directions orthogonal to the measurement lines are accumulated.

Then, the energy dispersion direction identifying portion 56 identifies the direction of energy dispersion of the monochromator 20 on the basis of the line profiles obtained by the line profile acquiring portion 54 (step S106).

The energy dispersion direction identifying portion 56 finds the ratio of a local maximum value A to a local minimum value B (contrast ratio A/B) of each of the line profiles and identifies the direction of energy dispersion based on the contrast ratios A/B. In particular, the energy dispersion direction identifying portion 56 takes the direction of the line profile having the lowest value of contrast ratio A/B as the direction of energy dispersion of the monochromator 20.

Figure 6:
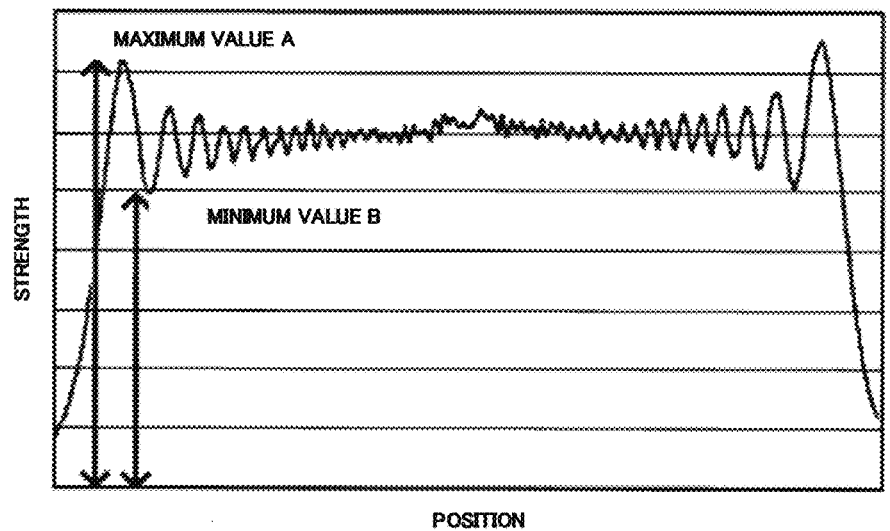
FIG. 6 is a graph showing the line profiles.

FIG. 6 is a graph showing the line profiles. It is herein assumed that the local maximum value A is a local maximum value corresponding to the strength of the outermost interference fringe (strength closest to the edge of the aperture) out of a plurality of local maximum values appearing on the line profiles. In the example of FIG. 6, the local maximum value A is the local maximum value initially appearing on each line profile. Also, it is assumed that the local minimum value B is that local minimum value of the plural local minimum values appearing on each line profile which is adjacent to the local maximum value A. In the example of FIG. 6, the local minimum value B is the local minimum value appearing next to the local maximum value A on each line profile.

The energy dispersion direction identifying portion 56 finds the contrast ratios A/B on all the line profiles and searches for the direction of line profile resulting in the lowest contrast ratio A/B.

Figure 7:
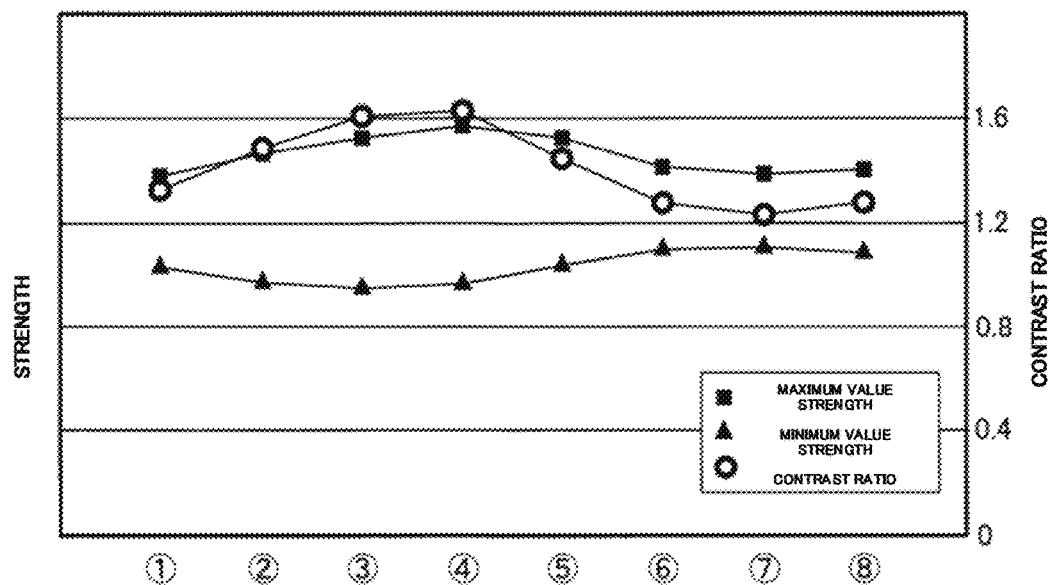
FIG. 7 is a graph showing contrast ratios A/B of 8 line profiles obtained by a line profile acquiring portion included in the electron microscope of FIG. 1.

FIG. 7 is a graph showing the contrast ratios A/B for the 8 line profiles obtained by the line profile acquiring portion 54. In FIG. 7, there are shown local maximum value A, local minimum value B, and contrast ratio A/B for each line profile.

In the graph shown in FIG. 7, the seventh line profile has a minimum contrast ratio A/B. The energy dispersion direction identifying portion 56 identifies the direction of the measurement line used to measure the seventh line profile shown in FIG. 5 as the direction of energy dispersion of the monochromator 20.

Then, the optics controller 58 controls the strength of the electromagnetic field of at least one of the first energy filter 22 and second energy filter 26 on the basis of the line profile in the direction of energy dispersion of the monochromator 20 to bring the chromatic plane on the exit side of the monochromator 20 into coincidence with the focal plane (step S108).

The optics controller 58 controls the strength of the electromagnetic field of at least one of the first energy filter 22 and second energy filter 26, for example, based on the contrast ratio A/B of the line profile in the direction of energy dispersion.

If the electromagnetic fields of the first energy filter 22 and second energy filter 26 are varied, the position of the achromatic plane on the exit side of the monochromator 20 will vary. That is, by varying the electromagnetic fields of the first energy filter 22 and second energy filter 26, the position of the chromatic plane can be varied independently while the position of the focal plane for the electron beam exiting from the monochromator 20 remains unchanged. If the strengths of the electromagnetic fields of the first and second energy filters 22, 26 are changed with consequent coincidence of the achromatic plane with the focal plane, then the interference fringes appearing on the TEM image exhibit the highest contrast.

Therefore, the chromatic plane and the focal plane can be brought into coincidence by controlling the strength of the electromagnetic field of at least one of the first energy filter 22 and the second energy filter 26 so as to maximize the contrast ratio A/B of the line profile in the direction of energy dispersion of the monochromator 20.

The optics controller 58 generates control signals for controlling the first energy filter 22 and second energy filter 26, outputs the control signals to the control unit 44, and controls the strength of the electromagnetic field of at least one of the first energy filter 22 and second energy filter 26 such that the contrast ratio A/B of the line profile in the direction of energy dispersion maximizes.

For example, the optics controller 58 monitors the contrast ratio A/B of the line profile in the direction of energy dispersion while varying the strengths of the electromagnetic fields of the first energy filter 22 and the second energy filter 26 and searches for the strengths of the electromagnetic fields of the first energy filter 22 and second energy filter 26 which maximize the contrast ratio A/B.

In the foregoing process, the optics controller 58 controls the energy filters 22 and 26 to maximize the contrast ratio A/B of the line profile. Alternatively, the optics controller 58 may control the energy filters 22 and 26 such that the contrast ratio A/B becomes equal to or greater than a given value.

Figure 8:
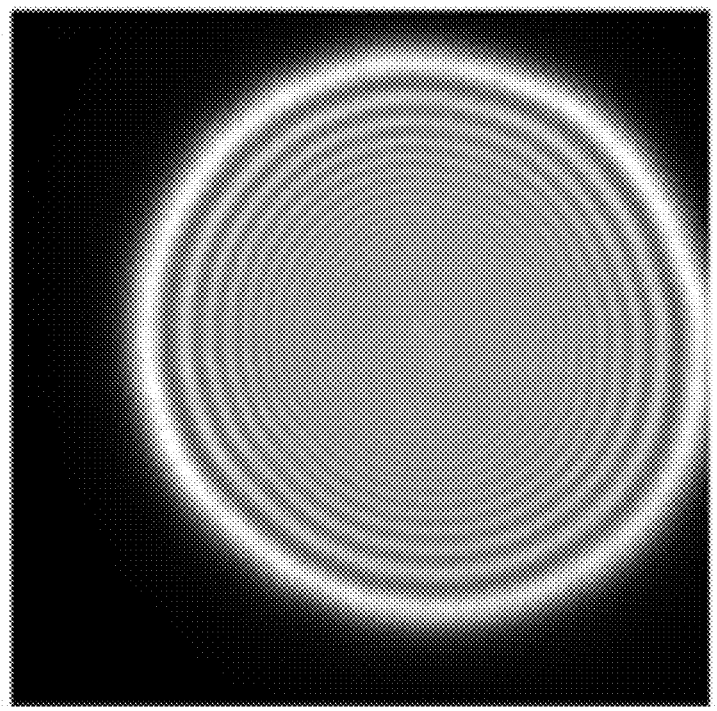
FIG. 8 is a TEM image containing interference fringes of the electron beam formed by the condenser aperture when the contrast ratio A/B of the line profile in the direction of dispersion is maximized.

FIG. 8 is a TEM image containing interference fringes of the electron beam formed by the condenser aperture 35 when the contrast ratio A/B of the line profile in the direction of energy dispersion of the monochromator 20 is maximized.

It can be seen from FIG. 8 that maximizing the contrast ratio A/B of the line profile in the direction of energy dispersion of the monochromator 20 results both in more isotropic interference fringes than the TEM image shown in FIG. 4 and in coincidence between the focal plane for the electron beam and the chromatic plane.

The electron microscope 100 associated with the present embodiment has the following features. In the electron microscope 100, the line profile acquiring portion 54 obtains the plurality of line profiles on the TEM image containing interference fringes of the electron beam formed by the condenser aperture 35 and identifies the direction of energy dispersion on the basis of the plural line profiles obtained by the line profile acquiring portion 54. The optics controller 58 controls the electromagnetic field of at least one of the first energy filter 22 and second energy filter 26 based on the line profile in the direction of energy dispersion to bring the focal plane for the electron beam exiting from the monochromator 20 into coincidence with the achromatic plane.

Therefore, in the electron microscope 100, the operation for bringing the focal plane for the electron beam exiting from the monochromator 20 into coincidence with the achromatic plane can be performed automatically. Consequently, in the electron microscope 100, the adjustment for bringing the focal plane for the electron beam exiting from the two-stage filter type monochromator 20 into coincidence with the achromatic plane can be made easily. As a result, in the electron microscope 100, the optical system can be set irrespective of the user's level of skill. The user can use the electron microscope under optimum conditions at all times.

Furthermore, in the electron microscope 100, the direction of energy dispersion of the monochromator 20 is identified. The energy filters 22 and 26 are controlled on the basis of the line profile in the direction of energy dispersion. Therefore, the processing can be made simpler, for example, than where the energy filters 22 and 26 are controlled on the basis of line profiles in plural directions.

In the electron microscope 100, the energy dispersion direction identifying portion 56 finds the contrast ratio A/B for each of the line profiles and identifies the direction of the line profile having the lowest contrast ratio A/B as the direction of energy dispersion of the monochromator 20. Therefore, in the electron microscope 100, the direction of energy dispersion can be identified from the plural line profiles generated by the line profile acquiring portion 54.

In the electron microscope 100, the optics controller 58 controls the electromagnetic field of at least one of the first energy filter 22 and second energy filter 26 on the basis of the line profile in the direction of energy dispersion of the monochromator 20 to bring the achromatic plane into coincidence with the focal plane. In particular, in the electron microscope 100, the optics controller 58 controls the electromagnetic field of at least one of the first energy filter 22 and second energy filter 26 to maximize the contrast ratio A/B of the line profile in the direction of energy dispersion. Consequently, in the electron microscope 100, the operation for bringing the focal plane and achromatic plane into coincidence can be performed automatically.

1.3. Modified Examples

Modified examples of the electron microscope 100 associated with the first embodiment are next described. In the above-described electron microscope 100, the optics controller 58 controls the strength of the electromagnetic field produced by at least one of the first energy filter 22 and second energy filter 26 on the basis of the line profile in the direction of energy dispersion of the monochromator 20 to bring the achromatic plane on the exit side of the monochromator 20 into coincidence with the focal plane. In the modified examples given below, the optics controller 58 performs different processing. In the following description, only the differences with the above-described electron microscope 100 shown in FIG. 1 are described; a description of similarities is omitted.

(1) First Modified Example

An electron microscope associated with a first modified example is different from the electron microscope 100 in that the optics controller 58 controls the first electrostatic lens 14 mounted ahead of the monochromator 20 on the basis of the line profile in the direction of energy dispersion of the monochromator 20 to bring the focal plane for the electron beam exiting from the monochromator 20 into coincidence with the achromatic plane.

If the lens strength of the first electrostatic lens 14 is varied, the incident angular aperture of the electron beam relative to the monochromator 20 varies, thereby changing the position of the focal plane for the electron beam exiting from the monochromator 20. That is, by varying the lens strength of the first electrostatic lens 14, the position of the focal plane can be varied independently while the position of the achromatic plane on the exit side of the monochromator 20 is held unchanged. If the strength of the first electrostatic lens 14 is varied with the result that the focal plane agrees with the achromatic plane, the interference fringes appearing on the TEM image exhibit the highest contrast.

Therefore, the chromatic plane and focal plane can be brought into coincidence by controlling the first electrostatic lens 14 so as to maximize the contrast ratio A/B of the line profile in the direction of energy dispersion of the monochromator 20.

The optics controller 58 generates a control signal for controlling the first electrostatic lens 14 and outputs the control signal to the control unit 44 to control the first electrostatic lens 14 such that the contrast ratio A/B of the line profile in the direction of energy dispersion of the monochromator 20 is maximized.

According to the present modified example, the operation for bringing the focal plane for the electron beam exiting from the monochromator 20 into coincidence with the achromatic plane can be performed automatically in the same manner as for the above-described electron microscope 100.

(2) Second Modified Example

An electron microscope associated with a second modified example is different from the electron microscope 100 in that the optics controller 58 controls astigmatism generated by the monochromator 20 on the basis of the line profile in the direction of energy dispersion of the monochromator 20 to bring the focal plane for the electron beam exiting from the monochromator 20 into coincidence with the achromatic plane.

In the present modified example, the monochromator 20 is configured so as to be capable of producing a quadrupolar electric field. Because the quadrupolar electric field is produced by the monochromator 20, the monochromator 20 can induce astigmatism in the electron beam. If the direction of the astigmatism induced by the monochromator 20 is set equal to the direction of the spectrum of the first energy filter 22 and second energy filter 26, and if the amount of the generated astigmatism is varied, then the position of the focal plane in the direction of spectrum on the exit side of the monochromator 20 varies. If the astigmatism induced by the monochromator 20 is varied with the result that the focal plane agrees with the achromatic plane, then the interference fringes appearing on the TEM image exhibit the highest contrast.

Therefore, the achromatic plane and focal plane can be brought into coincidence by controlling the quadrupolar electric field produced by the monochromator 20 so as to maximize the contrast ratio A/B of the line profile in the direction of energy dispersion of the monochromator 20.

The optics controller 58 generates a control signal for controlling the monochromator 20 and outputs the control signal to the control unit 44 to control the astigmatism induced by the monochromator 20 such that the contrast ratio A/B of the line profile in the direction of energy dispersion of the monochromator 20 maximizes.

According to the present modified example, the operation for bringing the focal plane for the electron beam exiting from the monochromator 20 into coincidence with the achromatic plane can be performed automatically in the same way as in the above-described electron microscope 100.

(3) Third Modified Example

An electron microscope associated with a third modified example is different from the electron microscope 100 in that the optics controller 58 controls the astigmatism induced by the monochromator 20 on the basis of the line profile in the direction of energy dispersion of the monochromator 20 to bring the focal plane for the electron beam exiting from the monochromator 20 into coincidence with the achromatic plane in the same manner as in the second modified example. However, in the third modified example, the monochromator 20 is configured to be capable of producing a quadrupolar magnetic field.

Because the monochromator 20 produces a quadrupolar magnetic field, the monochromator 20 can induce astigmatism in the electron beam in the same fashion as where the monochromator 20 produces a quadrupolar electric field.

Therefore, according to the present modified example, the operation for bringing the focal plane for the electron beam exiting from the monochromator 20 into coincidence with the achromatic plane can be performed automatically in the same way as in the above-described second modified example (i.e., in the same way as in the electron microscope 100).

If the monochromator 20 is configured to be capable of producing both a quadrupolar electric field and a quadrupolar magnetic field, the monochromator 20 may generate both the quadrupolar electric and magnetic fields, whereby the monochromator 20 induces astigmatism in the electron beam.

2. Second Embodiment

Figure 9:
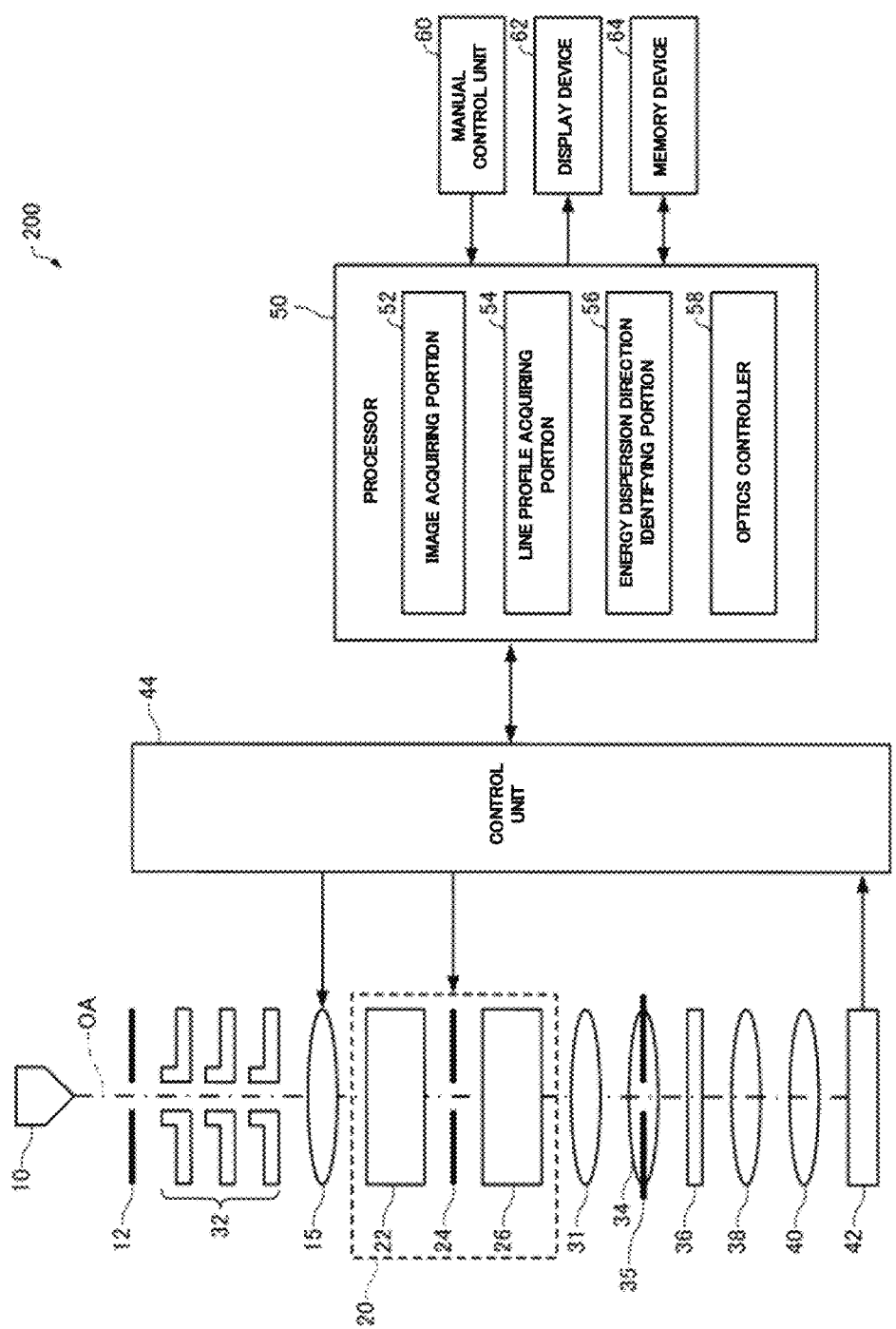
FIG. 9 is a diagram, partly in block form, showing the configuration of an electron microscope associated with a second embodiment.

An electron microscope associated with a second embodiment is next described by referring to FIG. 9, which shows the configuration of the electron microscope, 200, associated with the second embodiment. Those members of the electron microscope 200 which are similar in function to their respective counterparts of the electron microscope 100 associated with the first embodiment are indicated by the same reference numerals as in the above-cited figures and a detailed description thereof is omitted.

In the above-described electron microscope 100, the monochromator 20 is disposed ahead of the accelerator tube 32 as shown in FIG. 1. On the other hand, in the electron microscope 200, as shown in FIG. 9, the monochromator 20 is disposed behind the accelerator tube 32.

In the electron microscope 200, the first magnetic lens 15 is located ahead of the monochromator 20. The second magnetic lens 31 is positioned behind the monochromator 20. Each of the first and second magnetic lenses 15, 31 is a lens for focusing an electron beam by means of a magnetic field.

If the strength of the first magnetic lens 15 is varied, the incident angular aperture of the electron beam relative to the monochromator 20 changes, thus varying the position of the focal plane for the electron beam exiting from the monochromator 20. That is, by varying the strength of the first magnetic lens 15, the position of the focal plane can be varied independently while the position of the achromatic plane on the exit side of the monochromator 20 is maintained unchanged. If the strength of the first magnetic lens 15 is varied with the consequent result that the focal plane agrees with the achromatic plane, the interference fringes appearing on the TEM image exhibit the highest contrast.

Therefore, the chromatic plane and focal plane can be brought into coincidence by controlling the first magnetic lens 15 to maximize the contrast ratio A/B of the line profile in the direction of dispersion of the monochromator 20.

The optics controller 58 generates a control signal for controlling the first magnetic lens 15 and outputs the control signal to the control unit 44 to control the first magnetic lens 15 such that the contrast ratio A/B of the line profile in the direction of dispersion of the monochromator 20 maximizes.

In the electron microscope 200, the operation for bringing the focal plane for the electron beam exiting from the monochromator 20 into coincidence with the achromatic plane can be performed automatically in the same way as in the above-described electron microscope 100.

It is to be noted that the present invention is not restricted to the above-described embodiments but rather can be implemented in variously modified forms without departing from the gist of the present invention. For example, in the above embodiments, during the process (step S106) for identifying the direction of energy dispersion of the monochromator 20, the direction of line profile producing a minimum contrast ratio A/B (where A is a local maximum value and B is a local minimum value for each line profile) is taken as the direction of energy dispersion. Alternatively, in step S106, the direction of a line profile resulting in a minimum value out of local maximum values A of line profiles may be taken as the direction of energy dispersion. The direction of a line profile resulting in a maximum value out of local minimum values B of line profiles may be taken as the direction of energy dispersion. Even in these cases, the direction of energy dispersion can be identified in the same way as in the above embodiments. The operation for bringing the focal plane for the electron beam exiting from the monochromator 20 into coincidence with the achromatic plane can be performed automatically.

Furthermore, in the above embodiments, during the process (step S108) for bringing the achromatic plane into coincidence with the focal plane, the optical system is controlled to maximize the contrast ratio A/B of the line profile in the direction of energy dispersion. That is, the electromagnetic fields of the energy filters 22, 26, the lens strength of the first electrostatic lens 14, astigmatism produced in the monochromator 20, the lens strength of the first magnetic lens 15, or the like is controlled. Alternatively, in step S108, the optical system may be controlled to maximize the local maximum value A of the line profile in the direction of energy dispersion. Also, the optical system may be controlled in such a way that the local minimum value B of the line profile in the direction of dispersion minimizes. Even in these cases, the operation for bringing the focal plane for the electron beam exiting from the monochromator 20 into coincidence with the achromatic plane can be performed automatically in the same way as in the above embodiments.

In addition, in the above embodiments, the condenser aperture 35 is used as the aperture for forming interference fringes. The aperture for forming interference fringes is not restricted to the condenser aperture 35. Any aperture can be used as long as it is located behind the monochromator 20.

It is to be understood that the foregoing embodiments and modified examples are merely exemplary and that the present invention is restricted to them. For example, the embodiments and modified examples can be appropriately combined.

The present invention embraces configurations (e.g., configurations identical in function, method, and results or identical in purpose and advantageous effects) which are substantially identical to the configurations described in any one of the above embodiments. Furthermore, the invention embraces configurations which are similar to the configurations described in any one of the above embodiments except that their nonessential portions have been replaced. Additionally, the invention embraces configurations which are identical in advantageous effects to, or which can achieve the same object as, the configurations described in any one of the above embodiments. Further, the invention embraces configurations which are similar to the configurations described in any one of the above embodiments except that a well-known technique is added.

What is claimed is:

1. An electron microscope equipped with a monochromator that has a first energy filter for dispersing an electron beam according to kinetic energy, an energy-selecting slit disposed on an energy dispersive plane, and a second energy filter for canceling energy dispersion of the electron beam passed through the energy-selecting slit, said electron microscope comprising:

an image acquiring portion for obtaining an electron microscope image containing interference fringes of the electron beam formed by an aperture located behind the monochromator;

a line profile acquiring portion for obtaining a plurality of line profiles passing through a center of the aperture on the electron microscope image;

an energy dispersion direction identifying portion for identifying a direction of energy dispersion of the monochromator based on the plurality of line profiles obtained by the line profile acquiring portion; and an optics controller for controlling an optical system based on a line profile in the direction of energy dispersion to bring a focal plane for the electron beam exiting from the monochromator into coincidence with an achromatic plane.

2. The electron microscope as set forth in claim 1, wherein said energy dispersion direction identifying portion finds a ratio of a local maximum value to a local minimum value for each of the plurality of line profiles and identifies said direction of energy dispersion based on the found ratios.

3. The electron microscope as set forth in claim 1, wherein said optics controller controls said optical system based on a ratio of a local maximum value to a local minimum value of the line profile in said direction of energy dispersion.

4. The electron microscope as set forth in claim 1, wherein said optics controller controls a strength of an electromagnetic field of at least one of said first energy filter and said second energy filter based on the line profile in said direction of energy dispersion to bring said achromatic plane into coincidence with said focal plane.

5. The electron microscope as set forth in claim 1, wherein said optics controller controls an electrostatic lens mounted ahead of said monochromator based on the line profile in said direction of energy dispersion to bring said focal plane into coincidence with said achromatic plane.

6. The electron microscope as set forth in claim 1, wherein said optics controller controls a magnetic lens mounted ahead of said monochromator based on the line profile in said direction of energy dispersion to bring said focal plane into coincidence with said achromatic plane.

7. The electron microscope as set forth in claim 1, wherein said optics controller controls astigmatism produced by said monochromator based on the line profile in said direction of energy dispersion to bring said focal plane into coincidence with said achromatic plane.

* * * * *